(12) United States Patent
Onitsuka

(10) Patent No.: US 11,264,967 B2
(45) Date of Patent: Mar. 1, 2022

(54) MULTI-PIECE WIRING SUBSTRATE, ELECTRONIC COMPONENT HOUSING PACKAGE, ELECTRONIC DEVICE, AND ELECTRONIC MODULE

(71) Applicant: KYOCERA Corporation, Kyoto (JP)

(72) Inventor: Yoshitomo Onitsuka, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 163 days.

(21) Appl. No.: 16/650,989

(22) PCT Filed: Sep. 26, 2018

(86) PCT No.: PCT/JP2018/035662
§ 371 (c)(1),
(2) Date: Mar. 26, 2020

(87) PCT Pub. No.: WO2019/065724
PCT Pub. Date: Apr. 4, 2019

(65) Prior Publication Data
US 2020/0287517 A1  Sep. 10, 2020

(30) Foreign Application Priority Data

Sep. 27, 2017 (JP) .............................. JP2017-186552

(51) Int. Cl.
*H03H 9/05* (2006.01)
*H03H 9/10* (2006.01)
*H03H 9/19* (2006.01)

(52) U.S. Cl.
CPC ........ *H03H 9/0561* (2013.01); *H03H 9/0509* (2013.01); *H03H 9/1021* (2013.01); *H03H 9/19* (2013.01)

(58) Field of Classification Search
CPC .. H03H 9/0561; H03H 9/0509; H03H 9/1021; H03H 9/19; H01L 23/10;
(Continued)

(56) References Cited

U.S. PATENT DOCUMENTS

2014/0174803 A1* 6/2014 Suzuki ................. H05K 3/0052
174/258

FOREIGN PATENT DOCUMENTS

JP 2003-249589 A 9/2003

* cited by examiner

*Primary Examiner* — Jeffrey M Shin
(74) *Attorney, Agent, or Firm* — Volpe Koenig

(57) ABSTRACT

A multi-piece wiring substrate includes a matrix substrate including first and second insulating layers, and interconnection substrate regions arranged in a matrix. The matrix substrate includes dividing grooves opposing each other and disposed along boundaries between the interconnection substrate regions, and through-holes penetrating the matrix substrate in a thickness direction at positions where the dividing grooves are disposed. The inner surface conductor gradually decreases in thickness from a thick portion in a middle of the inner surface conductor, to thin portions disposed on a side of a boundary between the first and second insulating layers and on a first main surface side, and includes inclination portions each of which gradually increases in thickness from a boundary between corresponding one of the dividing grooves and the inner surface conductor to an inner surface of the inner surface conductor, in vertical sectional view.

12 Claims, 9 Drawing Sheets

(58) Field of Classification Search
CPC ... H01L 23/49805; H01L 23/04; H01L 23/12; H05K 2201/10015; H05K 2201/10022; H05K 2201/1003; H05K 2201/10083; H05K 2201/10098
See application file for complete search history.

MULTI-PIECE WIRING SUBSTRATE, ELECTRONIC COMPONENT HOUSING PACKAGE, ELECTRONIC DEVICE, AND ELECTRONIC MODULE

TECHNICAL FIELD

The present invention relates to a multi-piece wiring substrate in which a plurality of wiring substrate regions each including a mounting section for an electronic component are arranged in a matrix substrate. The present invention also relates to an electronic component housing package, an electronic device, and an electronic module.

BACKGROUND ART

Electronic component housing packages for use to house electronic components such as semiconductor elements or surface acoustic wave elements have been widely manufactured in the form of a so-called multi-piece wiring substrate designed such that a plurality of wiring substrates are simultaneously and collectively obtained from a matrix substrate with wide area. In such a multi-piece wiring substrate, a plurality of wiring substrate regions each of which is to be an electronic component housing package are arranged in a matrix in a matrix substrate, for example. In the main surface such as the upper surface of the matrix substrate, dividing grooves are disposed along boundaries between the interconnection substrate regions. The matrix substrate is fractured into pieces to create interconnection substrates by applying bending stress to the matrix substrate across each dividing groove.

In recent years, individual interconnection substrate has been getting smaller. For a multi-piece wiring substrate with the interconnection substrate regions arranged as described above, a method of forming dividing grooves with a laser beam of good positional accuracy is proposed (see Japanese Unexamined Patent Application Publication No. 2003-249589, for example).

SUMMARY OF INVENTION

A multi-piece wiring substrate of the disclosure includes a matrix substrate including a first main surface on which an external connection conductor is disposed a second main surface opposite to the first main surface a first insulating layer comprising the first main surface a second insulating layer comprising the second main surface and a plurality of interconnection substrate regions arranged in a matrix. The matrix substrate includes dividing grooves opposing each other and disposed in the first and second main surfaces along boundaries between the interconnection substrate regions, and through-holes penetrating the matrix substrate in a thickness direction at positions where the dividing grooves are disposed. Each of the through-holes includes a first through-hole which is disposed in the first insulating layer, an inner surface conductor connecting to the external connection conductor, and a second through-hole in the second insulating layer. The inner surface conductor gradually decreases in thickness from a thick portion in a middle of the inner surface conductor in the thickness direction of the first insulating layer, to thin portions disposed on a side of a boundary between the first and second insulating layers and on a side of the first main surface, and the inner surface conductor includes inclination portions each of which gradually increases in thickness from a boundary between a corresponding one of the dividing grooves and the inner surface conductor to an inner surface of the inner surface conductor, in vertical sectional view.

An electronic component housing package of the disclosure includes an insulating substrate, a first main surface, a second main surface opposite to the first main surface, a third main surface which is disposed between the first and second main surfaces and on which a mounting section is disposed for mounting an electronic component, and on which a connection conductor is disposed for connecting to the electronic component, a notch section, extending from the first main surface to the second main surface, on an outer edge of the insulating substrate, a plurality of external connection conductors disposed on the insulating substrate on the first main surface, and a cut surface and a fracture surface on a side surface of the insulating substrate. A side conductor including the fracture surface is disposed on a part of the notch section and is connected to a corresponding one of the external connection conductors. The side conductor gradually decreases in thickness from a thick portion in a middle of the side conductor in a thickness direction of the insulating substrate to thin portions disposed on a side of the third main surface and on a side of the first main surface, and includes an inclination portion which gradually increases in thickness from a boundary between the cut surface in the insulating substrate and the side conductor to an inner surface of the side conductor, in vertical sectional view.

An electronic device of the disclosure includes the electronic component housing package described above, and an electronic component mounted on the electronic component housing package.

An electronic module of the disclosure includes the electronic device described above, and a module substrate connecting to the electronic device.

DESCRIPTION OF EMBODIMENTS

Figure 1A:
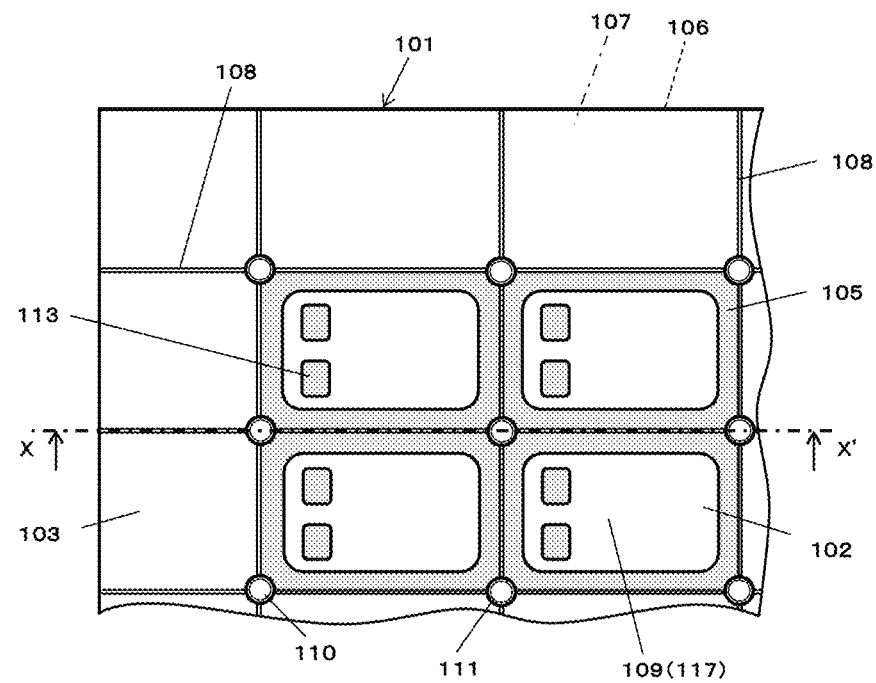
FIG. 1A is a plan view illustrating a part of a multi-piece wiring substrate of an embodiment.

Description is given of a multi-piece wiring substrate, an interconnection substrate as an electronic component housing package, and the like according to an embodiment of the disclosure with reference to the accompanying drawings. In FIGS. 1A to 10, the same sections are given the same reference numerals.

Each of interconnection substrates 200 arranged in a matrix substrate 101 includes a third main surface 117 having a recessed mounting section 109. The mounting section 109 accommodates an electronic component 204. Each interconnection substrate 200 includes: a first insulating layer 106a as a base section; and a second insulating layer 107a as a frame section laid on the base section. On the frame of a second main surface 107, a frame-shaped metallized layer 105 is disposed. To the frame-shaped metallized layer 105, a metallic lid is bonded with a brazing material. If a metallic frame is bonded to the frame-shaped metallized layer 105, a lid is bonded to the metallic frame. The interconnection substrate 200 includes connection conductors 113, which connect to the electronic component 204, external connection conductors 104, inner surface conductors 111, and the like. The electronic component 204 is bonded to the connection conductors 113 disposed in the mounting section 109 of the interconnection substrate 200, with a joining material 205 or the like, thus constituting an electronic device 300.

Figure 1B:
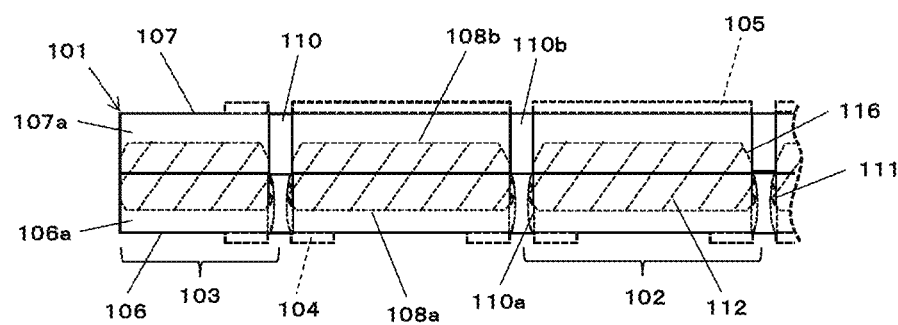
FIG. 1B is a transparent sectional view along a line X-X' of FIG. 1A.

The interconnection substrate 200 described above is manufactured in the form of a so-called multi-piece wiring substrate designed such that a plurality of wiring substrate regions 102 are simultaneously and collectively obtained from the matrix substrate 101 with large area. In the multi-piece wiring substrate, the plurality of wiring substrate regions 102 are arranged in a matrix on the matrix substrate 101, which is made of aluminum oxide sintered body, for example. As illustrated in FIGS. 1A and 1B, a plurality of wiring substrate regions 102, in each of which through-holes 110 are disposed in the outer periphery, are arranged in the matrix substrate 101. As for each through-hole 110 disposed in the outer periphery of each interconnection substrate region 102, an inner surface conductor 111 is disposed on a part of the inner surface of the through-hole 110. The inner surface conductors 111 and not-illustrated connection conductors have a function of electrically connecting wiring conductors of the interconnection substrate regions 102 adjacent to each other. FIGS. 1A and 1B illustrate a structure in which the through-holes 110 are disposed at the four corners of each interconnection substrate region 102. The through-holes 110 may be disposed at other than the four corners of each interconnection substrate region 102, or in the middle of each long side or on each short side, for example. The inner surface conductors 111 disposed in the through-holes 110, the connection conductors, and the like connect the connection conductors 113 or external connection conductors 104 of the interconnection substrate regions 102 adjacent to each other. The wiring conductors of the matrix substrate 101 are thereby integrally connected. For example, the connected wiring conductors of the matrix substrate 101 lead to a plating conductor disposed in the outer edge of a margin region 103 of the matrix substrate 101. By supplying electricity through the plating conductor, metal layers are attached to the external connection conductors 104 and the like through electroplating.

The matrix substrate 101 is made of ceramic sintered body, such as aluminum oxide sintered body, glass ceramic sintered body, aluminum nitride sintered body, silicon carbide sintered body, silicon nitride sintered body, G sintered body, for example. The matrix substrate 101 is fabricated by laminating a plurality of ceramic insulating layers to form a laminate body and integrally firing the laminate body. Specifically, the matrix substrate 101 made of aluminum oxide ceramic is fabricated in the following manner. First, a plurality of ceramic green sheets are prepared by adding raw material powder containing aluminum oxide and a glass component, such as silicon oxide, to a proper organic solvent and binder and shaping the resultant into sheets. Next, at least one of the a plurality of ceramic green sheets is subjected to stamping to form a ceramic green sheet including a plurality of frame sections. The ceramic green sheet including a plurality of frame sections is laid on one of the flat ceramic green sheets that are not subjected to stamping, thus preparing a laminate body. The laminate body is integrally fired to fabricate the matrix substrate 101, in which the interconnection substrate regions 102, each formed of a plurality of ceramic insulating layers laminated on top of each other, are arranged in a matrix. In the above-described case, the ceramic green sheet subjected to stamping corresponds to the second insulating layer 107a including frame sections while the ceramic green sheet not subjected to stamping corresponds to the first insulating layer 106a.

Each interconnection substrate 200 as an electronic component housing package includes the mounting section 109 for the electronic component 204 in the center of the upper surface thereof. The base section and frame section serve as a container protecting the electronic component 204 in the mounting section 109. The electronic component 204 in the mounting section 109 is selected from a variety of electronic components such as piezoelectric vibration elements including crystal vibration elements, surface acoustic wave elements, semiconductor elements (ICs), capacitor elements, inductor elements, and resistors.

If the electronic component 204 is a crystal vibration element and the electronic device 300 is a crystal device, for example, the interconnection substrate 200 is used as a package for a vibration element serving as a reference for frequency or time in the electronic device, such as communication devices including mobile phones and smartphones and information devices including computers and IC cards, and the electronic device 300 is used as a vibration element. The electronic component 204 in the mounting section 109 is electrically connected to the connection conductors 113 disposed on the third main surface 117 with a joining material 205, such as a conductive adhesive, for example.

The interconnection substrates 200 are pieces obtained by dividing a product fabricated in a so-called multi-piece form. For example, the plurality of wiring substrate regions 102 each including the mounting section 109 are arranged in a matrix in the matrix substrate 101 formed of a plurality of ceramic insulating layers laminated on top of each other. In the upper surface of the matrix substrate 101, dividing grooves 108 are formed along boundaries between the interconnection substrate regions 102 with a laser beam. The multi-piece wiring substrate like that illustrated in FIGS. 1A and 1B or other drawings, for example, is thereby constituted basically. The above-descried matrix substrate 101 is divided along the dividing grooves 108 between the interconnection substrate regions 102, thereby fabricating the interconnection substrates 200 as the electronic component housing packages.

Figure 2A:
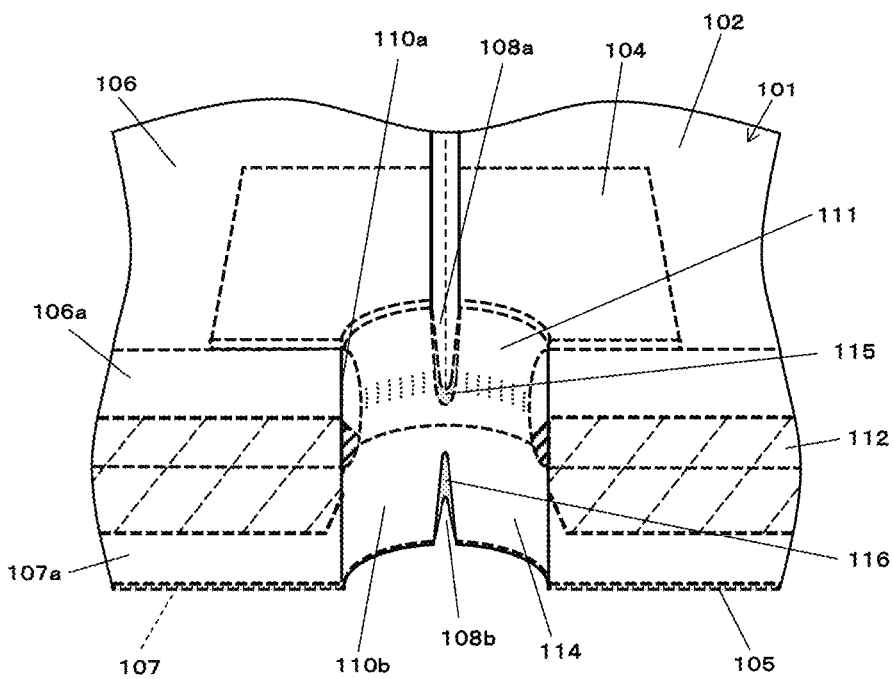
FIG. 2A is a perspective view of main part, illustrating the back surface and a vertical section of the multi-piece wiring substrate of the embodiment.
Figure 2B:
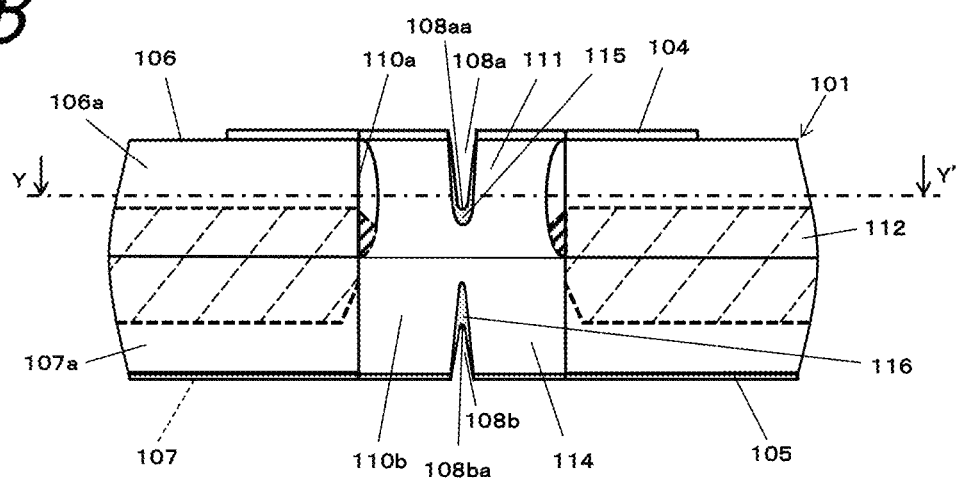
FIG. 2B is a vertical sectional view of FIG. 2A.

To divide the matrix substrate 101, first dividing grooves 108a are formed along the boundaries between the interconnection substrate regions 102 in a first main surface 106 of the matrix substrate 101 with a laser beam. Each first dividing groove 108a includes deeper part at the inner surface of each first through-hole 110a than in the first main surface 106. Each through-hole 110a lies across the boundary between the interconnection substrate regions 102 or lies across the boundary between one of the interconnection substrate regions 102 and the margin region 103. In the process of forming the dividing grooves 108 with a laser beam along the boundaries between the interconnection substrate regions 102, therefore, the inner surface conductor 111 disposed on a part of the inner surface of each of the first through-holes 110a is also exposed to the laser beam, and each dividing groove 108 is thereby deeper in the inner surface conductor 111 than in the other part. As illustrated in FIGS. 1A, 2A and 2B, or other drawings, in the thickness direction of the matrix substrate 101, each first dividing groove 108a increases in depth with a decrease in distance from the inner surface of the inner surface conductor 111. Second dividing grooves 108b are formed with the laser beam along the boundaries between the interconnection substrate regions 102 in the second main surface 107 of the matrix substrate 101. Each of the second dividing grooves 108b includes deeper part at the inner surface of each second through-holes 110b than in the second main surface 107 in a similar manner to the first dividing grooves 108a. In FIGS. 1A to 2B, or other drawings, the regions of the first and second dividing grooves 108a and 108b changing in depth are represented linearly. However, these regions may be curved by controlling the conditions for laser-beam processing of the dividing grooves 108. In each through-hole 110, the inner surface of the inner surface conductor 111 refers to a surface (an exposed part) of the inner surface conductor 111 exposed inside the through-hole 110 where the first dividing grooves 108a are not formed with a laser beam. The surface (exposed part) of the inner surface conductor 111 exposed inside the through-hole 110 before the first dividing grooves 108a are formed with a laser beam is also referred to as the inner surface of the inner surface conductor 111 for convenience.

The dividing grooves 108 include dividing grooves 108 on both sides, including: the first dividing grooves 108a in the first main surface 106; and the second dividing grooves 108b in the second main surface 107, opposing the respective first dividing grooves 108a. The dividing grooves 108 lie between the interconnection substrate regions 102 and between the interconnection substrate regions 102 and the margin region 103 in a grid in the matrix substrate 101. If stress is applied to the portions where the dividing grooves 108 are disposed (the boundaries between the interconnection substrate regions 102 and the like) in the matrix substrate 101 to bend the matrix substrate 101 in the thickness direction, the matrix substrate 101 is divided into pieces, forming the interconnection substrates 200.

Within and on the surface of each interconnection substrate 200, wiring conductors, including the connection conductors 113, are disposed from the bottom (the third main surface 117) of the mounting section 109 and the like to the lower surface (the first main surface 106) of the interconnection substrate 200. These trace conductors on the first main surface 106 of the interconnection substrate 200 include the external connection conductors 104, for example. The trace conductors within the interconnection substrate 200 include through conductors (so-called via conductors and the like), wiring conductors disposed in unexposed part of the connection conductors 113 for connection of the electronic component 204, and the like. If the electronic component 204 mounted on the mounting section 109 is electrically connected to the connection conductors 113, the electronic component 204 is electrically connected to an external electric circuit through the connection conductors 113, wiring conductors, external connection conductors 104, and the like.

Those wiring conductors are made of a metal material, such as copper, silver, palladium, gold, platinum, tungsten, molybdenum, and manganese, for example, or an alloy thereof. If the wiring conductors are made of molybdenum, which has a high-melting point, for example, the wiring conductors are formed as follows: metallization paste is prepared by adding molybdenum powder to an organic solvent and a binder and is applied to a ceramic green sheet as the interconnection substrates 200, in a predetermined pattern, followed by simultaneous firing.

On the aforementioned multi-piece wiring substrate (the matrix substrate 101), metallized conductor layers are formed that serve as the external connection conductors 104 of the interconnection substrate 200 at four corners of the lower surface (in the first main surface 106) of each interconnection substrate region 102 after the matrix substrate 101 is divided. The outer periphery of each external connection conductor 104 is in contact with the inner surface conductor 111 in the corresponding through-hole 110, for example. The external connection conductors 104 are made of metal, such as tungsten or molybdenum, for example. If the external connection conductors 104 are made of a molybdenum metallized conductor layer, for example, the external connection conductors 104 are formed as follows: metallization paste is prepared by adding molybdenum powder to an organic solvent, a binder, and the like and is printed in a predetermined pattern on the lower surface of a ceramic green sheet as the base of the ceramic insulating layer. The metallization paste is applied by screen printing or the like so that the external connection conductors 104 is about 7 to 15 μm thick after being fired, for example.

Furthermore, metallic frames may be bonded with a brazing material to the upper surface of the frame-shaped metallized layer 105 disposed on the first main surface 106. The metallic frames may be bonded to the multi-piece wiring substrate or bonded to the respective electronic component housing packages (the interconnection substrates 200). In the light of productivity, the aforementioned bonding is performed for the multi-piece wiring substrate. Metallic lids are then bonded to the metallic frames, and the electronic components 204 are thereby sealed in the respective mounting sections 109. In the above-described example of the embodiment, metallic layers, including a nickel plating layer and a gold plating layer, are sequentially attached to exposed surfaces of the frame-shaped metallized layer 105, connection conductors 113, external connection conductors 104, and the like. For example, the nickel plating layer has a thickness of about 1.0 to 20 μm, and the gold plating layer has a thickness of about 0.1 to 1.0 μm. Because of these plating layers, the exposed surfaces of the wiring conductors are covered with the metallic layers. The wiring conductors therefore have high resistance to corrosion and provide good wettability of solder, brazing materials, and the like.

The multi-piece wiring substrate of the embodiment of the disclosure includes the matrix substrate 101 including: the first main surface 106 on which the external connection conductors 104 are disposed; the second main surface 107 opposite to the first main surface 106; the first insulating layer 106a having the first main surface 106; and the second insulating layer 107a having the second main surface 107. The matrix substrate 101 includes a plurality of wiring substrate regions 102 arranged in a matrix. In the matrix substrate 101, the dividing grooves 108 in the first and second main surfaces 106 and 107 oppose each other and extend along boundaries between the interconnection substrate regions 102. Furthermore, the through-holes 110 penetrating the matrix substrate 101 in the thickness direction are disposed at the positions where the dividing grooves 108 are disposed. The through-holes 110 include the first through-holes 110a in the first insulating layer 106a and the second through-holes 110b in the second insulating layer 107a. In the first through-holes 110a, the inner surface conductors 111 connecting to the external connection conductors 104 are disposed. In vertical sectional view, each of the inner surface conductors 111 gradually decreases in thickness from the thick portion in the middle of the inner surface conductor 111 in the thickness direction of the first insulating layer 106a to the thin portions disposed on the side of the boundary between the first and second insulating layers 106a and 107a and on the side of the first main surface 106. The inner surface conductor 111 includes an inclination portion 115, which gradually increases in thickness from the boundary between the dividing groove 108 and the inner surface conductor 111 to the inner surface of the inner surface conductor 111.

According to the aforementioned configuration, in the process of cutting the dividing grooves 108 with a laser beam on the boundaries between the plurality of wiring substrate regions 102 arranged in the matrix substrate 101, if the laser beam moves and is projected onto one of the inner surface conductors 111, the laser beam strikes the thick portion in the middle of the inner surface conductor 111. The laser beam is therefore less likely to reach the side of the inner surface conductor 111 opposite to the surface irradiated with the laser beam (the thick portion of the inner surface conductor 111 serves as a laser beam shield). This suppresses the inner surface conductor 111 from being disconnected or suppresses the conduction resistance from degrading due to the decrease in sectional area of the inner surface conductor 111.

Furthermore, the inner surface of the inner surface conductor 111 is inclined to the laser beam projected vertically downward. This increases the area of the inner surface conductor 111 irradiated with the laser beam. In the inner surface of the inner surface conductor 111, the laser grooving is likely to extend in both the depth and width directions. The inner surface conductor 111 is chamfered in ranges from the boundaries between each dividing groove 108 and inner surface conductor 111 to the inner surface of the inner surface conductor 111 to form the inclination portions 115. The portions of the inner surface conductor 111 facing each other in the horizontal direction at the bottom of the dividing groove 108 (108aa, 108ba) are separated from each other in the process of electroplating. It is therefore possible to suppress the portions of the inner surface conductor 111 from connecting to each other due to electroplating. This improves the dividing properties of the matrix substrate 101 and suppresses the inner surface conductors 111 from separating from the interconnection substrates 200 obtained by dividing the matrix substrate 101.

In order for each of the inner surface conductors 111 to in vertical sectional view, gradually decreases in thickness from the thick portion in the middle of the inner surface conductor 111 in the thickness direction of the first insulating layer 106a to the thin portions disposed on the side of the boundary between the first and second insulating layers 106a and 107a and on the side of the first main surface 106, for example, the through-holes 110 are formed at predetermined positions in the ceramic green sheet as the first insulating layer 106a, and the ceramic green sheet is placed on a printing table so that the through-holes 110 correspond to suction holes in the printing table. Above the through-holes 110 in the ceramic green sheet, openings formed in a screen for screen printing are aligned to the respective through-holes 110. Metallization paste of tungsten, molybdenum, or the like is poured into the through-holes 110 while some of the metallization paste is sucked and removed. This is based on the characteristics of the employed metallization paste which is likely to be thick in the middle of the printed matter after printing due to the viscosity thereof.

By adjusting the viscosity of the metallization paste in the above description, the metallization paste is attached to the inner surfaces of the through-holes 110 so as to be thick in the center of the ceramic green sheet in vertical sectional view. For example, in order that the metallization layer (as the inner surface conductors 111) attached to the inner surface of each through-hole 110 has thicknesses of about 5 to 20 μm in the thick portion and thin portions after being printed, the metallization paste for the inner surface conductor 111 needs to have a higher viscosity than the metallization paste for the other wiring conductors. The ceramic green sheet as the second insulating layer 107a in which the through-holes 110 are at the predetermined positions in the same way as described above and the ceramic green sheet for the first insulating layer 106a are laid on each other and then fired. This allows for fabrication of the matrix substrate 101 illustrated in FIGS. 1A and 1B, in which the inner surface conductors 111 are disposed in the inner through-holes 110 of the first insulating layer 106a so as to, in vertical sectional view, each gradually decrease in thickness from the thick portion in the middle of the inner surface conductor 111 in the thickness direction of the first insulating layer 106a to the thin portions on the side of the boundary between the first and second insulating layers 106a and 107a and on the side of the first main surface 106 while no inner surface conductors 111 are disposed in the through-holes 110 of the second insulating layer 107a. The method of forming the inner surface conductors 111 is not limited to the aforementioned method.

In the multi-piece wiring substrate of the embodiment of the disclosure, the dividing grooves 108 include the first dividing grooves 108a in the first main surface 106 and the second dividing grooves 108b in the second main surface 107. In the inner surface of each inner surface conductor 111, the width of the bottom 108aa of the first dividing groove 108a is greater than the bottom 108ba of the second dividing groove 108b. In the process of electroplating for exposed wiring conductors in the plurality of wiring substrate regions 102 arranged in the matrix substrate 101, the aforementioned configuration suppresses both ends of each inner surface conductor 111 at the bottom 108aa of the first dividing groove 108a in the inner surface conductor 111 from being connected with plating. In the process of dividing the matrix substrate 101, cracking is more likely to proceed from the bottom 108ba of the second dividing groove 108b to the bottom 108aa of the first dividing groove 108a. The matrix substrate 101 is thereby easily divided. It is therefore possible to suppress the interconnection substrates 200 obtained by dividing the matrix substrate 101 from including burrs or chips and suppress the inner surface conductors 111 from separating due to active stress during the process of dividing the matrix substrate 101.

As illustrated in FIGS. 2A and 2B, the inner surface conductor 111 is not disposed in the bottom 108*ba* of the second dividing groove 108*b* in the side of the second through-hole 110*b*. Herein, the laser beam to form the second dividing groove 108*b* is projected vertically in the direction from the second main surface 107 to the first main surface 106. The laser beam strikes a part of the inner surface of the through-hole 110 in which ceramic is exposed, thus forming a deep groove portion 116. However, the inner surface of the through-hole 110 in which ceramic is exposed is not visible in a plan view, and the laser grooving is less likely to proceed in the width direction.

In the bottom 108*aa* of the first dividing groove 108*a* in the side of the first through-hole 110*a*, the inner surface conductor 111 is disposed. Herein, the laser beam to form the first dividing groove 108*a* is projected vertically in the direction from the first main surface 106 to the second main surface 107. Since the inner surface of the inner surface conductor 111 including the thick and thin portions gradually increases in inclination to the laser beam, from each thin portion to the thick portion, the area of the inner surface conductor 111 irradiated with the laser beam gradually decreases from each thin portion to the thick portion. In the inner surface of the thick portion of the inner surface conductor 111, the laser grooving is more likely to extend in both the depth and width directions. The inner surface conductor 111 is thereby chamfered in ranges from the boundaries between the dividing groove 108 and inner surface conductor 111 to the inner surface of the inner surface conductor 111, forming the inclination portions 115. As illustrated in FIGS. 2A and 2B, therefore, the width of the bottom 108*aa* of the first dividing groove 108*a* is greater than the bottom 108*ba* of each second dividing groove 108*b*.

In the process of forming the first dividing groove 108*a*, the thick portion of each inner surface conductor 111 serves as the laser beam shield since the inner surface of the inner surface conductor 111 inclines. The laser grooving is likely to proceed in the width direction but is thereby less likely to proceed in the depth direction. In other words, large area where the laser grooving does not proceed in the depth direction of the inner surface conductor 111 remains in the side opposite to the surface irradiated with the laser beam. The inner surface conductor 111 therefore has a comparatively large sectional area after the first dividing groove 108*a* is formed. It is therefore possible to effectively suppress the inner surface conductors 111 from being disconnected and from increasing in conduction resistance.

In the multi-piece wiring substrate of the embodiment of the disclosure, each inclination portion 115 gradually increases in width from the first main surface 106 to the bottom 108*aa* of the first dividing groove 108*a*. In the process of dividing the matrix substrate 101, the aforementioned configuration facilitates cracking from the bottom 108*ba* of the second dividing groove 108*b* to the bottom 108*aa* of the first dividing groove 108*a*. The matrix substrate 101 is thereby divided more effectively. It is therefore possible to more effectively suppress the interconnection substrates 200 obtained by dividing the matrix substrate 101 from including burrs or chips and suppress the inner surface conductors 111 from separating due to active stress during the process of dividing the matrix substrate 101.

As illustrated in FIGS. 2A and 2B, in the vicinity of the first main surface 106, the metallized layer as the inner surface conductor 111 has small thickness, and the inner surface of the thin portion of the inner surface conductor 111 has a small inclination. If the laser beam is projected toward the first main surface 106, therefore, large area of the inner surface conductor 111 is irradiated with the laser beam, and the laser grooving is more likely to proceed in the depth direction. On the other hand, since the metallized layer is thin, the inclination portions 115 are less likely to be formed. In the vicinity of the bottom 108*aa* of the first dividing groove 108*a*, the inner surface of the thick portion of the inner surface conductor 111 has a large inclination, and the inner surface conductor 111 is less likely to be irradiated with the laser beam. In addition, the thick portion serves as the laser beam shield, and the laser grooving is less likely to proceed in the depth direction. However, the metallized layer as the inner surface conductor 111 is thick, and the energy of the laser beam is more likely to be absorbed by the inner surface conductor 111. This facilitates groove formation in the width direction with the laser beam, so that the inclination portions 115 are more likely to be formed. The inclination portions 115 are thereby effectively disposed so as to gradually increase in width from the first main surface 106 to the bottom 108*aa* of the first dividing groove 108*a*.

In each through-hole 110 disposed in the second insulating layer 107*a* on the second main surface 107 side, no inner surface conductor 111 is disposed as illustrated in FIGS. 2A and 2B. If the laser beam is projected toward the second main surface 107, the second insulating layer 107*a* is less likely to absorb the energy of the laser beam, and the laser grooving is less likely to proceed in the width direction and is more likely to proceed in the depth direction (the direction that the laser beam is projected). The second dividing groove 108*b* and deep groove portion 116 are formed as illustrated in FIGS. 2A and 2B. In the process of dividing the matrix substrate 101, therefore, cracking is more likely to proceed from the bottom 108*ba* of the second dividing groove 108*b* to the bottom 108*aa* of the first dividing groove 108*a*. The projected laser beam is likely to be absorbed by metal, such as tungsten and molybdenum constituting the inner surface conductors 111. Regions in which ceramic is exposed like the second through-holes 110*b* do not contain metal (other than metal oxides), such as tungsten or molybdenum, and are less likely to absorb the energy of the laser beam. The inclination portions 115 therefore tend to increase in width with the thickness of the inner surface conductor 111. The width of the inclination portions 115 are affected more by the thickness of the inner surface conductor 111 than by the magnitude of the inclination of the inner surface of the inner surface conductor 111.

Figure 3:
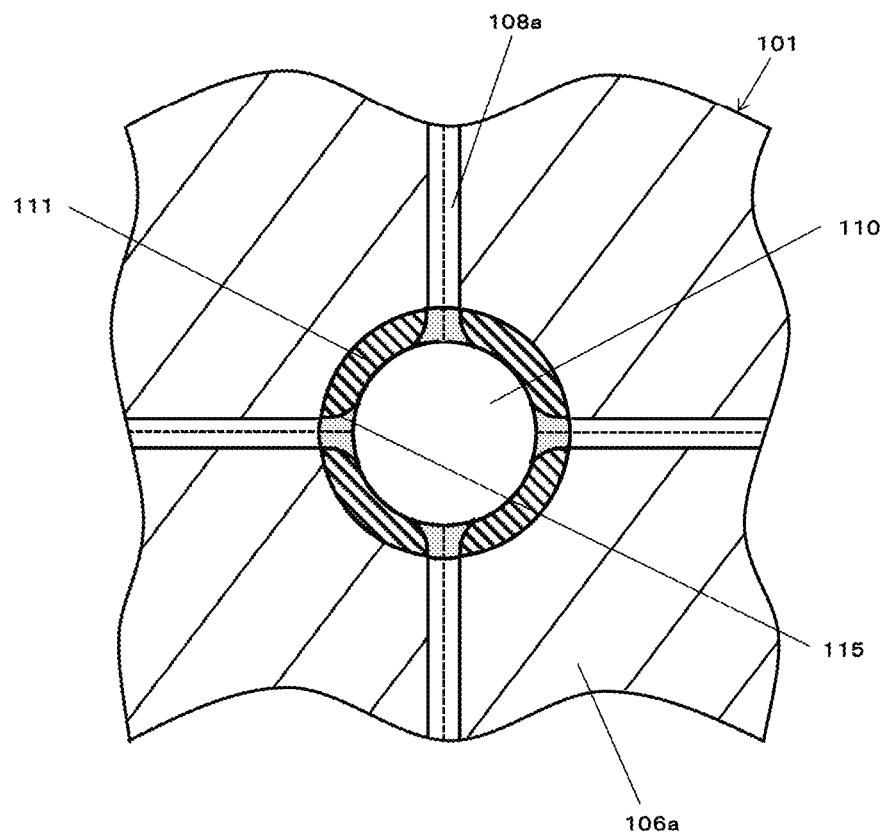
FIG. 3 is a sectional view of main part, corresponding to a line Y-Y' of the multi-piece wiring substrate illustrated in FIG. 2B.
Figure 4A:
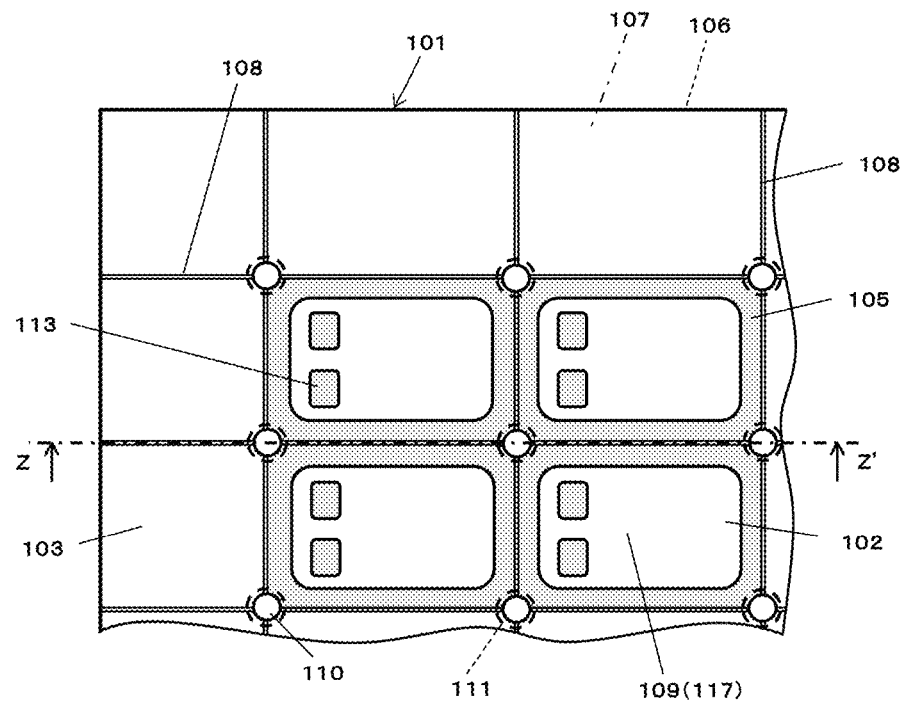
FIG. 4A is a plan view illustrating a part of a multi-piece wiring substrate of another example of the embodiment.
Figure 4B:
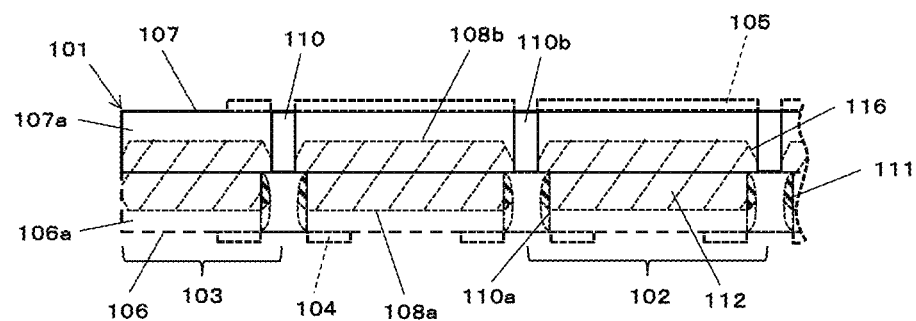
FIG. 4B is a transparent sectional view along a line Z-Z' of FIG. 4A.

FIG. 3 illustrates the inclination portions 115 each extended from the first main surface 106 side to the bottom 108*aa* of the first dividing groove 108*a* (illustrated in FIGS. 2A and 2B). FIG. 3 is a plan sectional view taken along a line Y-Y' of FIG. 2B. As illustrated in FIG. 3, the first dividing grooves 108*a* are disposed in the first main surface 106 along the boundaries between the interconnection substrate regions 102 arranged in the matrix substrate 101 and extends deeper than the depth of the insulating layer in Y-Y' plan sectional view. At the position where the first dividing grooves 108*a* are disposed, the through-hole 110 penetrates the matrix substrate 101 in the thickness direction, and the inner surface conductor 111 is disposed on the inner surface of the through-hole 110. In plan sectional view along the Y-Y', the first dividing grooves 108*a* are also disposed in the inner surface conductor 111. In vertical sectional view of the inner surface conductor 111, the inner surface conductor 111 gradually decreases in thickness from the thick portion in the middle of the inner surface conductor 111 in the thickness direction of the first insulating layer 106a to the thin portions disposed on the side of the boundary between the first and second insulating layers 106a and 107a and on the side of the first main surface 106. In plan sectional view along the line Y-Y', the inner surface conductor 111 has the substantially same thickness along the entire circumference of the through-hole 110.

As illustrated in FIG. 3, each inclination portion 115 is chamfered to be convex in a range from the boundary between the first insulating layer 106a and the inner surface conductor 111 to the inner surface of the inner surface conductor 111 on the extension of the first dividing groove 108a. On the first main surface 106 side of Y-Y' plan sectional view in FIG. 2B, the inclination portion 115 is chamfered to form a convex portion having a smaller width than that in Y-Y' plan sectional view, in a range from the boundary between the first insulating layer 106a and the inner surface conductor 111 to the inner surface of the inner surface conductor 111 on the extension of the first dividing groove 108a. On the second main surface 107 side of Y-Y' plan sectional view in FIG. 2B, the inclination portion 115 is chamfered to form a convex portion having a greater width than that in Y-Y' plan sectional view, in a range from the boundary between the first insulating layer 106a and the inner surface conductor 111 to the inner surface of the inner surface conductor 111 on the extension of the first dividing groove 108a.

As described above, in the matrix substrate 101, the inclination portion 115 gradually increases in width from the first main surface 106 to the bottom 108aa of the first dividing groove 108a. The deeper the first dividing groove 108a, the closer to each other the portions of the inner surface conductor 111 facing each other in the horizontal direction at the bottom 108aa of the first dividing groove 108a. In the vicinity of the bottom 108aa of the first dividing groove 108a, because of the inclination portion 115, the metallized layer as the inner surface conductor 111 has a small thickness, and the closer the distance to the inner surface of the inner surface conductor 111, the wider the distance between the portions of the inner surface conductor 111 facing each other in the horizontal direction across the first dividing groove 108a. The matrix substrate 101 is thereby divided more effectively. It is therefore possible to more effectively suppress the interconnection substrates 200 obtained by dividing the matrix substrate 101 from including burrs or chips and suppress the inner surface conductors 111 from separating due to active stress during the process of dividing the matrix substrate 101.

The electronic component housing package (the interconnection substrate 200) of the embodiment of the disclosure includes: the insulating substrate 201; the first main surface 106; the second main surface 107 opposite to the first main surface 106; the third main surface 117 which is disposed between the first and second main surfaces 106 and 107 and on which the mounting section 109 is disposed for mounting the electronic component 204, and on which the connection conductors 113 is disposed for connecting to the electronic component 204; notch sections 114 extended from the first main surface 106 to the second main surface 107 in the outer edge of the insulating substrate 201; a plurality of external connection conductors 104 disposed on the insulating substrate 201 on the first main surface 106; and cut surfaces (the surfaces where the dividing grooves 108 are disposed) and fracture surfaces 112 in the side surface of the insulating substrate 201. The electronic component housing package includes side conductors 206 which are partially disposed on the respective notch sections 114, connect to the external connection conductors 104, and include the fracture surfaces 112. In vertical sectional view, each side conductor 206 gradually decreases in thickness from the thick portion in the middle of the side conductor 206 in the thickness direction of the insulating substrate 201, to the thin portion on the side of the third main surface 117 and the thin portion on the side of the first main surface 106, and includes inclination portions 115 each of which gradually increases in thickness from the boundary between the cut surface of the insulating substrate 201 and the side conductor 206 to the inner surface of the side conductor 206. Because of the above-described configuration, each corner of the side conductor 206 is chamfered as the inclination portion 115. In addition, the side conductor 206 is firmly attached on the inner side surface of the notch section 114 and is thereby suppressed from separating from the notch section 114. In the notch section 114, the inner surface of the side conductor 206 refers to the surface exposed inside the notch section 114 and does not include any cut surface.

Figure 8A:
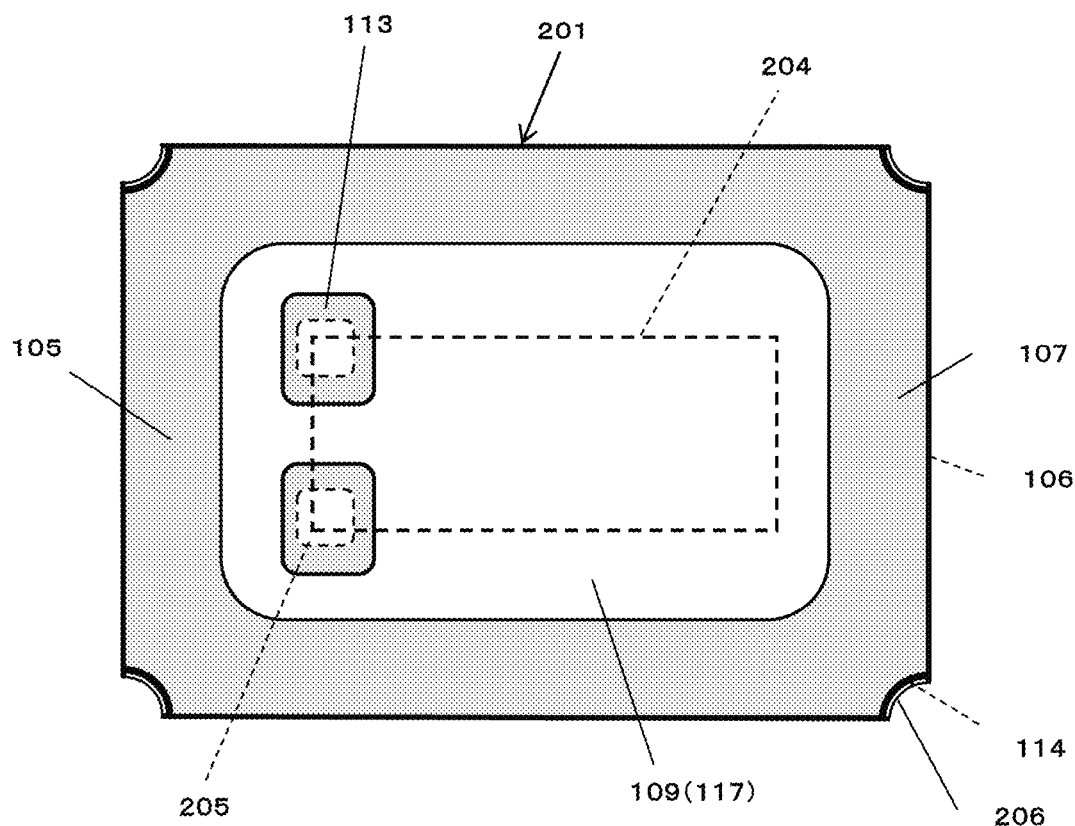
FIG. 8A is a plan view illustrating an electronic component housing package of the embodiment.
Figure 8B:
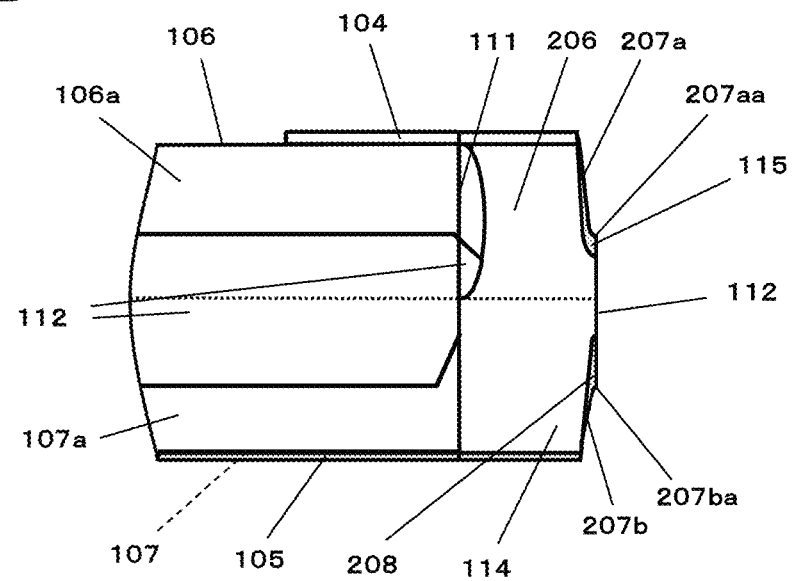
FIG. 8B is a side view of main part of FIG. 8A.
Figure 9:
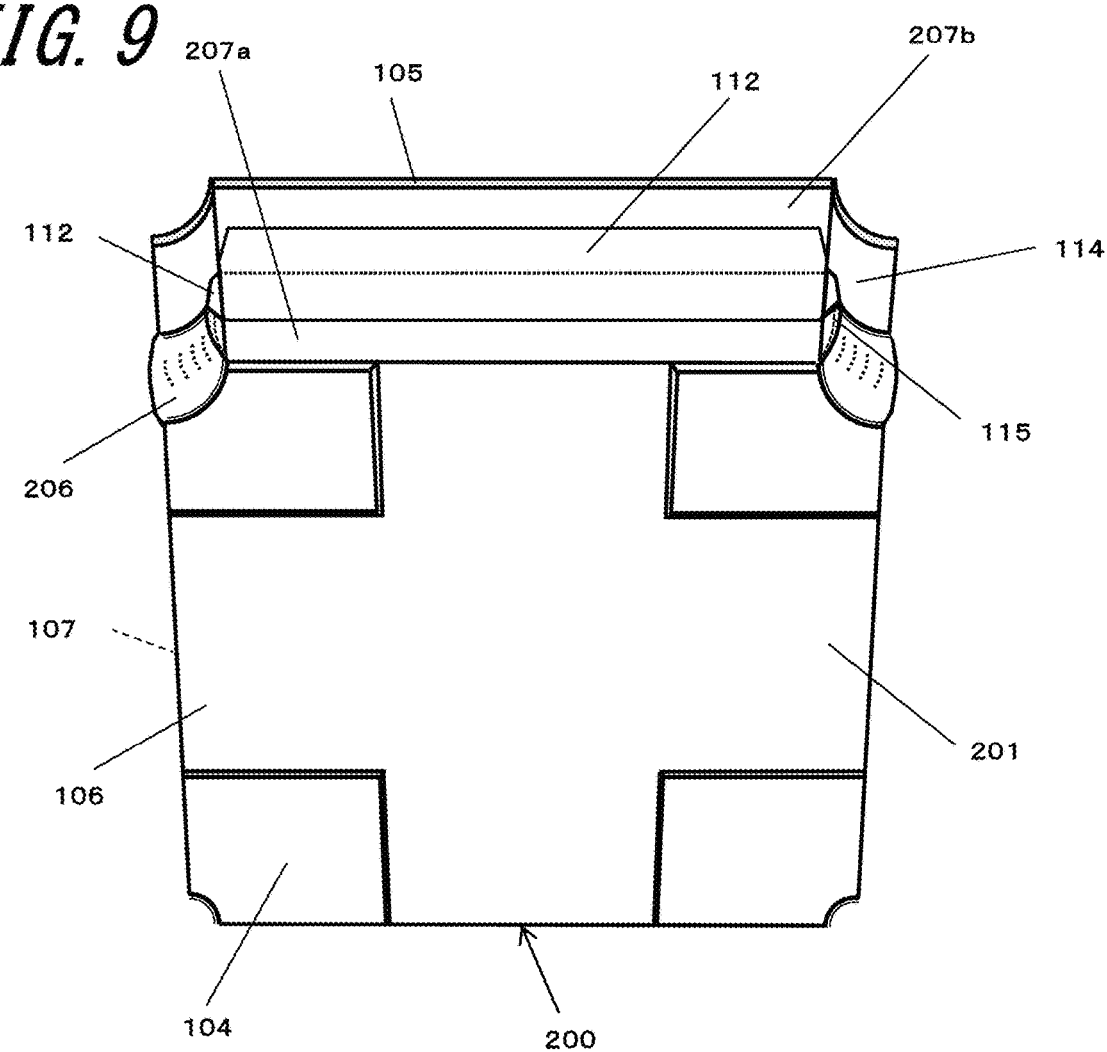
FIG. 9 is a perspective view of the back and side surfaces, illustrating the electronic component housing package of the embodiment.
Figure 10:
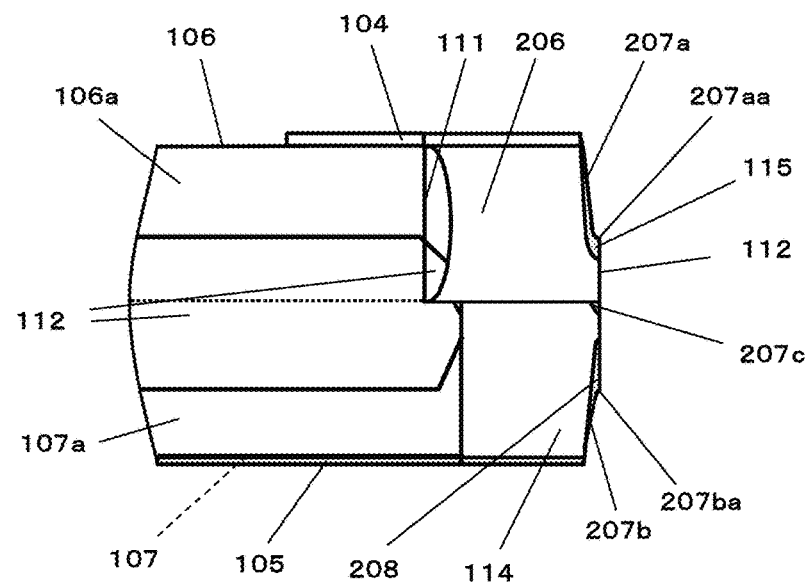
FIG. 10 is a side view of main part, illustrating an electronic component housing package of another example of the embodiment.

As an example of the interconnection substrate 200 as the electronic component housing package according to the embodiment of the disclosure, FIGS. 8A and 8B illustrate a plan view of the interconnection substrate 200, and FIG. 9 illustrates a perspective view of the back surface of the interconnection substrate 200 as seen from a short side thereof. In FIGS. 8A and 8B, the interconnection substrate 200 includes the insulating substrate 201, the first main surface 106, and the second main surface 107 opposite to the first main surface 106. In addition, the mounting section 109 between the first and second main surfaces 106 and 107, on which the electronic component 204 is mounted; and the third main surface 117 on which the connection conductors 113 connecting to the electronic component 204 are disposed. In the mounting section 109 disposed on the third main surface 117 of the insulating substrate 201, a pair of the connection conductors 113 is disposed along a short side. The electronic component 204 (a crystal vibration element, for example), such as a crystal vibration element or a semiconductor element, is connected to the pair of connection conductors 113 with the joining material 205, such as a conductive adhesive and is accommodated in the mounting section 109. A lid is bonded to the frame-shaped metallized layer 105 surrounding the mounting section 109 in a plan view, on the upper surface of the frame section (the second main surface 107) with a brazing material or the like for airtight-sealing of the mounting section 109.

The brazing material is integrated on the lower surface of the lid in advance. The lid made of metal is placed on the frame-shaped metallized layer 105 for heat treatment. The lid is thereby bonded to the frame-shaped metallized layer 105, so that the mounting section 109 is airtight-sealed. The interconnection substrate 200 may employ the following airtight sealing method. A metallic lid is placed on a metallic frame bonded to the upper surface of the insulating substrate 201 by brazing or the like in advance. A pair of roller electrodes of a seam welder is rotated while being in contact with the outer periphery of the lid as a large current for welding is applied across the roller electrodes. The region of contact between each roller electrode and the lid becomes hot due to the resistance heat, and the lid is thereby seam welded to the metallic frame.

FIG. 9 illustrates the perspective view of the back surface of the interconnection substrate 200 as seen from a short side. The notch sections 114 are extended from the first main surface 106 to the second main surface 107 in the outer edge of the insulating substrate 201. The plurality of external connection conductors 104 are disposed on the insulating substrate 201 in the first main surface 106. The cut surfaces and fracture surfaces 112 are in the side surface of the insulating substrate 201. Furthermore, the side conductor 206 including the fracture surfaces 112 is on a part of the notch sections 114 and connects to the external connection conductor 104. In vertical sectional view, the side conductor 206 gradually decreases in thickness from the thick portion in the middle of the side conductor 206 in the thickness direction of the insulating substrate 201 to the thin portion on the side of the third main surface 117 and the thin portion on the side of the first main surface 106. Furthermore, the inclination portion 115 gradually increases in thickness from the boundary between the cut surface of the insulating substrate 201 and the side conductor 206 to the inner surface of the side conductor 206.

As illustrated in FIG. 3, each corner of the side conductor 206 (inner surface conductor 111) is chamfered as the inclination portions 115. Furthermore, as illustrated in FIG. 9, in vertical sectional view, the side conductor 206 gradually decreases in thickness from the thick portion in the middle of the side conductor 206 in the thickness direction of the insulating substrate 201, to the thin portion on the side of the third main surface 117 and the thin portion on the side of the first main surface 106. The thick portions of the side conductors 206 disposed on the notch sections 114 at the four corners of the insulating substrate 201 are able to improve the strength of the side conductors 206 themselves as the metallized layers. This suppresses the side conductors 206 from separating from the insulating substrate 201 if the interconnection substrate regions 102 adjacent to each other are pulled to both sides in the process of dividing the matrix substrate 101 into the interconnection substrate regions 102. The side conductors 206 are thereby attached to the inner surfaces of the notch sections 114 firmly. The inner surface conductor 111 as the side conductor 206 obtained by dividing the matrix substrate 101 includes the thin portion on the side of the first main surface 106 in the thickness direction of the inner surface conductor 111. The thin portion is already subjected the laser grooving in a non-contact way as illustrated in FIGS. 2A and 2B. The thin portion is therefore less likely to separate from the notch section 114 even if the metalized layer of the thin portion itself has low strength. In addition, because of the inclination portion 115 disposed on the second main surface 107 side of the bottom 108*aa* of the first dividing groove 108*a* in the inner surface conductor 111, a part of the thick portion of the inner surface conductor is thin in the dividing direction. In the process of dividing the matrix substrate 101, the inclination portion 115 therefore facilitates cracking from the bottom 108*ba* of the second dividing groove 108*b* to the bottom 108*aa* of the first dividing groove 108*a*. The matrix substrate 101 is thereby easily divided, and the interconnection substrates obtained by dividing the matrix substrate 101 are suppressed from including burrs or chips.

As illustrated in FIG. 8B, in vertical sectional view of the electronic component housing package of the embodiment of the disclosure, the cut surfaces include a first cut surface 207*a* and a second cut surface 207*b*. The first cut surface 207*a* is disposed on the side of the first main surface 106 and includes a first curve portion 207*aa* at the edge on the fracture surface 112 side. The second cut surface 207*b* is disposed on the side of the second main surface 107 and includes a second curve portion 207*ba* at the edge on the fracture surface 112 side. In the inner surface of the side conductor 206, the width of the first curve portion 207*aa* of the first cut surface 207*a* is greater than the width of the second curve portion 207*ba* of the second cut surface 207*b*.

The aforementioned configuration facilitates cracking from the bottom 108*ba* of the second dividing groove 108*b* to the bottom 108*aa* of the first dividing groove 108*a* in the process of dividing the matrix substrate 101 including the electronic component housing packages. The matrix substrate 101 is thereby divided easily. It is therefore possible to suppress the electronic component housing packages obtained by dividing the matrix substrate 101 from including burrs or chips and suppress the side conductors 206 (the inner surface conductors 111) from separating from the insulating substrate 201 due to active stress during the process of dividing the matrix substrate 101. The first cut surface 207*a* corresponds to the first dividing groove 108*a*; the first curve portion 207*aa*, the bottom 108*aa* of the first dividing groove 108*a*; the second cut surface 207*b*, the second dividing groove 108*b*; the second curve portion 207*ba*, the bottom 108*ba* of the second dividing groove 108*b*; and a deep cut surface 208, a deep groove portion 116.

In the electronic component housing package of the embodiment of the disclosure, each inclination portion 115 increases in width from the first main surface 106 to the first curve portion 207*aa* of the first cut surface 207*a*. The aforementioned configuration facilitates cracking from the bottom 108*ba* of the second dividing groove 108*b* to the bottom 108*aa* of the first dividing groove 108*a* in the process of dividing the matrix substrate 101 including the electronic component housing packages. The matrix substrate 101 is thereby divided more effectively. It is possible to suppress the interconnection substrate 200 obtained by dividing the matrix substrate 101 from including burrs or chips and suppress the side conductors 206 (the inner surface conductors 111) from separating from the insulating substrate 201 due to active stress during the process of dividing the matrix substrate 101.

Figure 5:
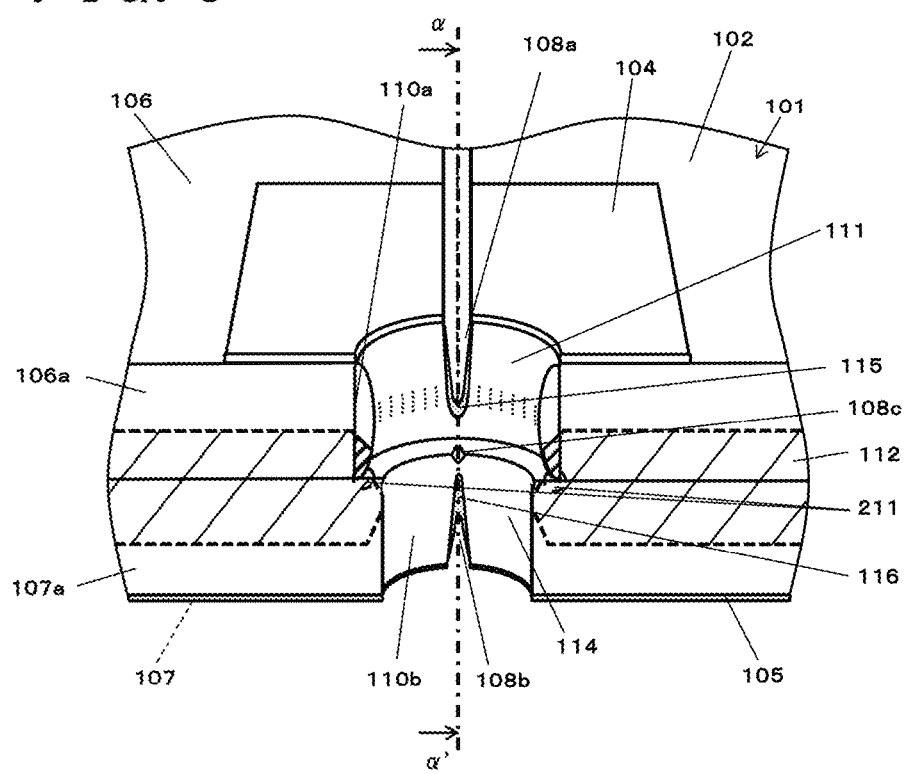
FIG. 5 is a perspective view of main part, illustrating the back surface and a vertical section of the multi-piece wiring substrate of the other example of the embodiment.

As illustrated by the matrix substrate 101 in FIGS. 1A to 2B, the electronic component housing package (interconnection substrate 200) of the disclosure employs the structure in which the diameter of the first through-holes 110*a* as the notch sections 114 disposed in the first insulating layer 106*a* is the same as the diameter of the second through-holes 110*b* as the notch sections 114 disposed in the second insulating layer 107*a*. The electronic component housing package (the interconnection substrate 200) of the disclosure also may employ a structure in which as illustrated by the matrix substrate 101 in FIGS. 4A and 4B or FIG. 5, the diameter of the first through-holes 110*a* as the notch sections 114 disposed in the first insulating layer 106*a* is greater than the diameter of the second through-holes 110*b* as the notch sections 114 disposed in the second insulating layer 107*a*. In the aforementioned configuration, the inner surface of each notch section 114 where the inner surface conductor 111 as the side conductor 206 is disposed as illustrated in FIG. 5 has large area. The inner surface conductor 111 and the external connection conductor 104 on the first main surface 106 are thereby connected at an interface with large width. As illustrated in the side view of the main part in FIG. 10, the interconnection substrate 200 obtained by dividing the matrix substrate 101 therefore implements a structure in which the side conductors 206 are properly connected to the external connection conductors 104 on the first main surface 106.

Herein, the method of forming the dividing grooves 108 with a laser beam on line α-α' of FIG. 5, in the matrix substrate 101 illustrated in FIG. 5 is described in detail based on FIGS. 6A, 6B, 7C, and 7D. FIGS. 6A, 6B, 7C, and 7D do not illustrate the external connection conductors 104 and frame-shaped metallized layer 105 for convenience.

Figure 6A:
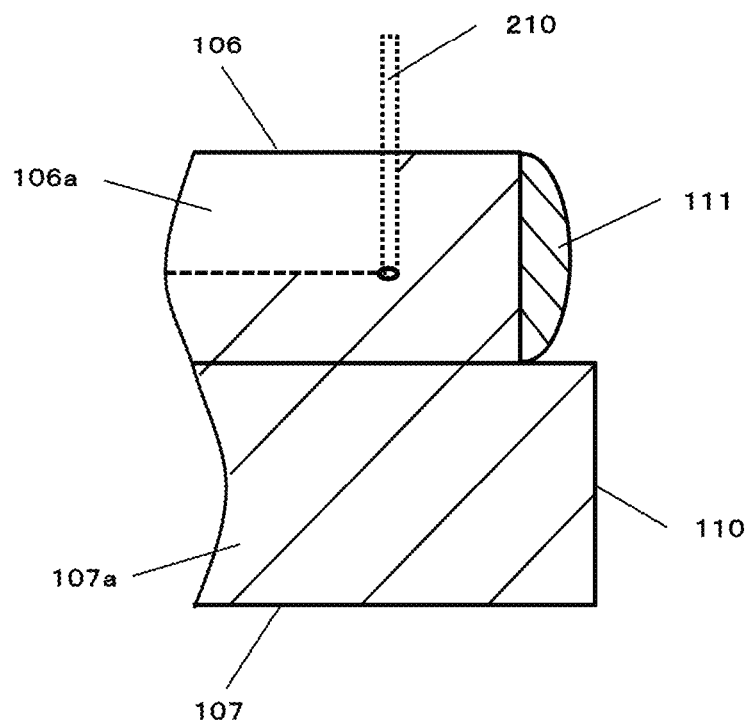
FIGS. 6A and 6B are vertical sectional views illustrating a method of manufacturing the multi-piece wiring substrate according to the other example of the embodiment.

FIG. 6A illustrates formation of the first dividing groove 108a in the first main surface 106 of the matrix substrate 101 (an unfired ceramic green sheet laminate body) with a laser beam 210. The laser beam 210 is moved along the boundaries between the a plurality of wiring substrate regions 102 or boundaries between each interconnection substrate region 102 and the margin region 103, in the matrix substrate 101. The first dividing groove 108a is thereby formed in the depth direction of the first insulating layer 106a of the matrix substrate 101 to the same depth as grooving is performed toward the region in which the through-hole 110 is disposed.

Figure 6B:
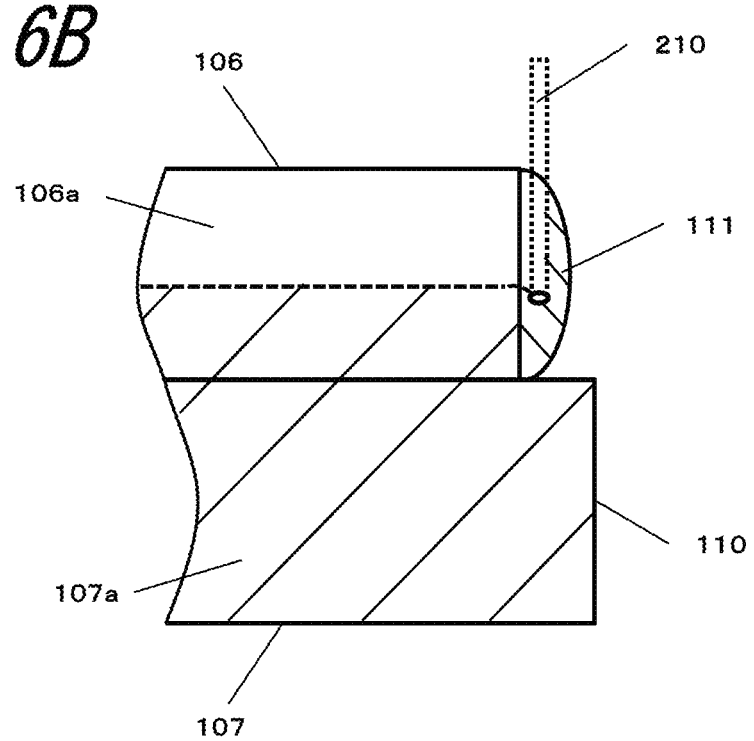

Next, as illustrated in FIG. 6B, in the vicinity of the through-hole 110 as the notch section 114, the laser beam 210 is also projected on the inner surface conductor 111 exposed in the inner surface of the through-hole 110, and the first dividing groove 108a is formed in the depth direction of the first insulating layer 106a to a greater depth. Since the inner surface of the inner surface conductor 111 is inclined to the laser beam 210 projected vertically downward in the aforementioned process, larger area of the inner surface conductor 111 is irradiated with the laser beam 210. In the inner surface of the inner surface conductor 111, the laser grooving is more likely to extend in both the depth and width directions. The inner surface conductor 111 is thereby chamfered in ranges from the boundaries between the dividing groove 108 and the inner surface conductor 111 to the inner surface of the inner surface conductor 111, forming the inclination portions 115.

Figure 7C:
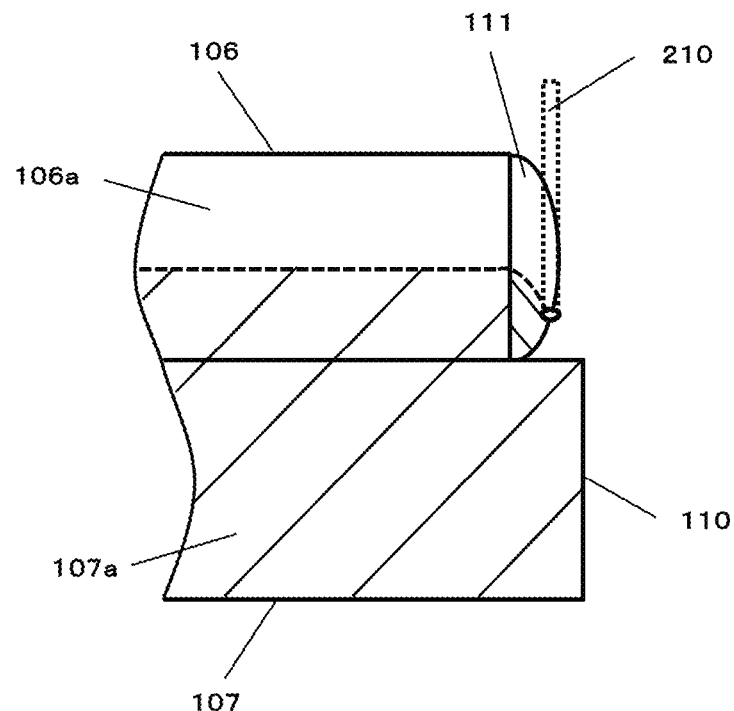
FIGS. 7C and 7D are vertical sectional views illustrating the method of manufacturing the multi-piece wiring substrate according to the other example of the embodiment, following FIG. 6B.
Figure 7D:
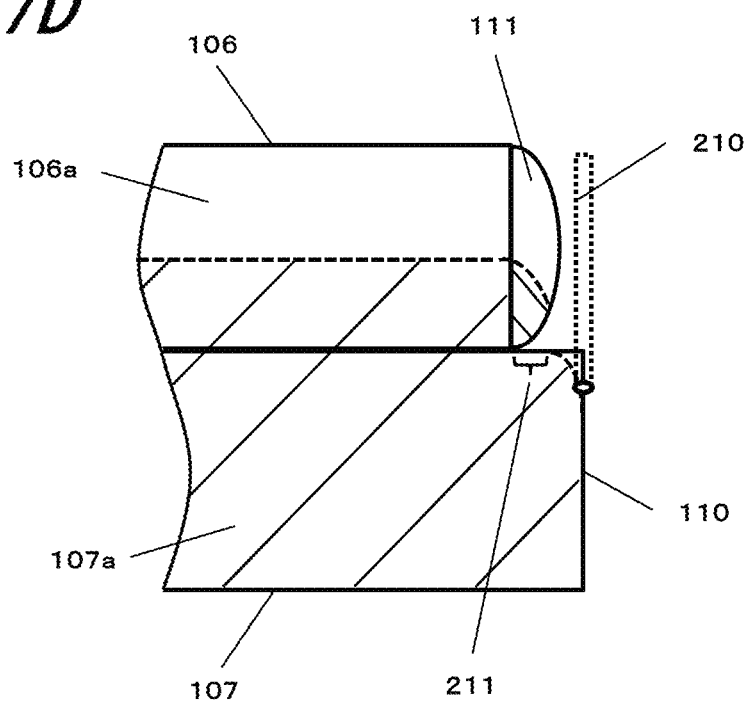

Next, as illustrated in FIGS. 7C and 7D, the laser beam 210 which is moving and forming the cut surface (in the extension of the first dividing groove 108a in the inner surface conductor 111) in the inner surface conductor 111 is projected on a part of the second insulating layer 107a which is disposed on the side of the first insulating layer 106a and is exposed in the through-hole 110. This forms a dividing groove 108c at the step section in the second insulating layer 107a with the laser beam 210 projected toward the first main surface 106. Because of the aforementioned movement of the laser beam 210, as illustrated in FIG. 7D, cut surfaces are disposed on the side of the first main surface 106 in the inner surface conductor 111, and a region where no cut surface is disposed (the region to be a fracture surface in the inner surface conductor 111 if the matrix substrate 101 is divided) is disposed on the side of the second main surface 107 in the inner surface conductor 111. The dividing groove 108c at the step section corresponds to a step-section cut surface 207c in the electronic component housing package after the matrix substrate 101 is divided.

On the first insulating layer 106a side in the second insulating layer 107a, a no-dividing groove region 211 is disposed under the inner surface conductor 111. The no-dividing groove region 211 reveals that the thick portion of the inner surface conductor 111 acts as the laser beam shield and provides a region where no cut surface is disposed in the inner surface conductor 111. As described above, the matrix substrate 101 illustrated in FIG. 5 is fabricated by the method of forming the dividing grooves 108 by the laser beam illustrated in FIGS. 6A, 6B, 7C and 7D. In the step of forming the dividing groove following the step of FIG. 7D, the laser beam 210 is further moved from the through-hole 110 to the inner surface conductor 111 and then the first insulating layer 106a, forming the first dividing groove 108a. The first dividing groove 108a is then formed by the reverse process to that illustrated in FIGS. 6A, 6B, 7C and 7D. The first dividing groove 108a thus formed has a substantially symmetrical shape to the center of the through-hole 110.

The above example illustrates grooving with the laser beam 210 in the matrix substrate 101 of FIG. 5. The grooving with the laser beam 210 in the matrix substrate 101 illustrated in FIGS. 2A and 2B is performed in the same process. In the structure illustrated in FIGS. 2A and 2B, since the diameter of the first through-holes 110a as the notch sections 114 in the first insulating layer 106a is the same as the diameter of the second through-holes 110b as the notch sections 114 in the second insulating layer 107a, the no-dividing groove region 211 is not created under the inner surface conductor 111. The grooving with the laser beam 210 for the matrix substrate 101 is performed for an unfired laminate body of ceramic green sheets but may be performed for the matrix substrate 101 which is already fired but not plated.

According to the aforementioned method of forming dividing grooves, the region of the inner surface conductor 111 not including any cut surface has a large sectional area. This suppresses the inner surface conductor 111 from being disconnected by the laser beam 210 or suppresses the conduction resistance from degrading due to a decrease in sectional area of the inner surface conductor 111. It is therefore possible to provide the interconnection substrate 200 in which metallic layers, such as a nickel plating layer or gold plating layer, are properly attached to the wiring conductors exposed in the interconnection substrate regions 102 by electroplating.

The electronic device 300 according to the embodiment of the disclosure includes the above-described electronic component housing package (the interconnection substrate 200) and the electronic component 204 mounted on the electronic component housing package. Even if the electronic component housing package is further miniaturized, the aforementioned configuration allows the side conductors 206 to be firmly attached to the inner side surfaces of the notch sections 114. It is therefore possible to provide the electronic device 300 ensuring good attachment of metallic layers to wiring conductors by electroplating and high reliability in connection between the electronic component 204 and the wiring conductors.

In the interconnection substrate 200 as the electronic component housing package constituting the electronic device 300, even if the laser beam 210 is moved and projected onto the inner surface conductor 111 in the process of forming the dividing grooves 108 on the boundaries between the plurality of wiring substrate regions 102 arranged in the matrix substrate 101 with the laser beam, the laser beam strikes the thick portion in the middle of the inner surface conductor 111. The side of the inner surface conductor 111 opposite to the surface irradiated with the laser beam is less likely to be exposed to the laser beam (the thick portion of the inner surface conductor 111 serves as the laser beam shield). This suppresses the inner surface conductor 111 from being disconnected or suppresses the conduction resistance from degrading due to a decrease in sectional area of the inner surface conductor 111. It is therefore possible to provide the interconnection substrate 200 in which the metallic layers, such as a nickel plating layer or gold plating layer, are properly attached to the wiring conductors exposed in the interconnection substrate regions 102 by electroplating.

By using the aforementioned interconnection substrate 200, even if the interconnection substrate 200 as the electronic component housing package is miniaturized, the interconnection substrate regions 102 are efficiently connected to each other through the inner surface conductors 111 disposed on the circumferences of the through-holes 110 at four corners of each interconnection substrate region 102 as the interconnection substrate 200. The metallic layers, such as a nickel plating layer or gold plating layer, are thereby properly attached to the wiring conductors exposed in the interconnection substrate regions 102 by electroplating. It is therefore possible to provide the electronic device 300 that improves in reliability of connection between the connection conductors 113 and electronic component 204 and reliability of connection between the external connection conductors 104 and an external electric circuit.

Furthermore, in the interconnection substrate 200 included in the electronic device 300, each inclination portion 115 gradually increases in thickness from the boundary between the cut surface of the insulating substrate 201 and the side conductor 206 to the inner surface of the side conductor 206. The corners at both ends of each side conductor 206 on the side of the first main surface 106 in the interconnection substrate 200 are therefore less likely to form a sharp angle. In the process of accommodating the electronic device 300 in a tray or the like for transportation, the interconnection substrate 200 is less likely to be caught by the inner side surface of the tray or the like even if the tray is made of a soft material. This effectively facilitates accommodating the interconnection substrate 200 in the tray for transportation or the like. In addition, the aforementioned configuration suppresses dust from being produced if the corners of each side conductor 206 of the interconnection substrate 200 come into contact with the inner side surface of the tray and gouge out the tray during transportation.

An electronic module 400 according to the embodiment of the disclosure includes the electronic device 300 described above and a module substrate 401 connecting to the electronic device 300. With the above configuration using the electronic device 300 described above, it is possible to provide the electronic module 400 of high operation reliability that includes the electronic device 300 in which the side conductors 206 are firmly attached to the inner side surfaces of the notch sections 114 even if the electronic component housing package is miniaturized and which ensures good attachment of the metallic layers to the wiring conductors by electroplating and high reliability of connection between the electronic component 204 and the electronic device 300.

The interconnection substrate 200 includes: the notch sections 114 extended from the first main surface 106 to the second main surface 107 in the outer edge of the insulating substrate 201; the plurality of external connection conductors 104 disposed on the insulating substrate 201 in the first main surface 106; and the cut surfaces and fracture surfaces 112 in the side surface of the insulating substrate 201. The interconnection substrate 200 further includes the side conductors 206 each of which is disposed on a part of the corresponding notch section 114, connects to the corresponding external connection conductor 104, and includes fracture surfaces. The inclination portion 115 is disposed so that in vertical sectional view, the side conductor 206 gradually decreases in thickness from the thick portion in the middle of the side conductor 206 in the thickness direction of the insulating substrate 201 to the thin portion on the side of the third main surface 117 and the thin portion on the side of the first main surface 106. The thick portion of the side conductor 206 strengthens the side conductor 206 as the metallized layer itself.

Still furthermore, the thin portion is already subjected to laser grooving in a non-contact way. The thin portion is therefore less likely to separate from the insulating substrate 201 even if the metalized layer of the thin portion itself has low strength. A part of the inclination portion 115 disposed on the second main surface 107 side of the first curve portion 207*aa* of the cut surface (corresponding to the first dividing groove 108*a*) disposed in the side conductor 206 is disposed so that a part of the thick portion of the side conductor 206 is thin in the dividing direction. Because of the part of the inclination portion 115 disposed on the second main surface 107 side of the first curve portion 207*aa*, in the process of dividing the matrix substrate 101, cracking is more likely to proceed from the bottom 108*ba* of the second dividing groove 108*b* to the bottom 108*aa* of the first dividing groove 108*a*. The matrix substrate 101 is thereby easily divided. This allows fabrication of the electronic device 300 including the interconnection substrate 200 suppressed from including burrs and chips after the matrix substrate 101 is divided. The electronic device 300 has external dimensions with a high degree of precision as the electronic device 300, and the side conductors 206 in the electronic device 300 are suppressed from separating from the insulating substrate 201. It is therefore possible to provide the electronic module 400 of high operation reliability in which the electronic device 300 of high mounting reliability and good electric characteristics is mounted on the module substrate 401.

The multi-piece wiring substrate (the matrix substrate 101), electronic component housing package (the interconnection substrate 200), and the like of the disclosure are not limited to those in the example of the aforementioned embodiment and certainly can be added with various changes without departing from the scope of the disclosure. For example, in the above-described example of the embodiment, the matrix substrate 101 of the multi-piece wiring substrate includes the interconnection substrate regions 102, in which the recessed mounting sections are disposed, are arranged in the laminate body including two layers of the first and second insulating layers 106*a* and 107*a*. However, the multi-piece wiring substrate may include a matrix substrate in which flat interconnection substrates each including a not-recessed mounting section in the upper surface are arranged. The multi-piece wiring substrate may include a matrix substrate formed of a laminate body of three or more layers, including the first insulating layer 106*a* having two or more layers and the second insulating layer 107*a* having two or more layers. Furthermore, the through-holes 110 disposed at four corners of each interconnection substrate region 102 arranged in the matrix substrate 101 is circular but may have an elliptical shape or a long-hole shape. In such a case, the shape of the notch sections 114 of the interconnection substrates 200 obtained by dividing the matrix substrate 101 may be a quarter of the elliptical or long-hole shape.

The invention claimed is:
1. A multi-piece wiring substrate, comprising
   a matrix substrate comprising
   a first main surface on which an external connection conductor is disposed,
   a second main surface opposite to the first main surface,
   a first insulating layer comprising the first main surface,
   a second insulating layer comprising the second main surface, and
   a plurality of interconnection substrate regions arranged in a matrix, comprises dividing grooves opposing each other and disposed in the first and second main surfaces along boundaries between the interconnection substrate regions, and
   through-holes penetrating the matrix substrate in a thickness direction at positions where the dividing grooves are disposed, each of the through-holes comprising a first through-hole which is disposed in the first insulating layer, an inner surface conductor connecting to the external connection conductor, and a second through-hole in the second insulating layer, wherein the inner surface conductor gradually decreases in thickness from a thick portion in a middle of the inner surface conductor in the thickness direction of the first insulating layer, to thin portions disposed on a side of a boundary between the first and second insulating layers and on a side of the first main surface, and wherein the inner surface conductor comprises inclination portions each of which gradually increases in thickness from a boundary between a corresponding one of the dividing grooves and the inner surface conductor to an inner surface of the inner surface conductor, in vertical sectional view.

2. The multi-piece wiring substrate according to claim 1, wherein the dividing grooves comprise a first dividing groove in the first main surface and a second dividing groove in the second main surface, and a bottom width of the first dividing groove is greater than a bottom width of the second dividing groove in the inner surface of the inner surface conductor.

3. The multi-piece wiring substrate according to claim 2, wherein the inclination portion gradually increases in width from the first main surface to the bottom of the first dividing groove.

4. An electronic component housing package, comprising:
an insulating substrate;
a first main surface;
a second main surface opposite to the first main surface;
a third main surface which is disposed between the first and second main surfaces and on which a mounting section is disposed for mounting an electronic component, and on which a connection conductor is disposed for connecting to the electronic component;
a notch section, extending from the first main surface to the second main surface, on an outer edge of the insulating substrate;
a plurality of external connection conductors disposed on the insulating substrate on the first main surface; and
a cut surface and a fracture surface on a side surface of the insulating substrate, wherein
a side conductor comprising the fracture surface is disposed on a part of the notch section and is connected to a corresponding one of the external connection conductors, and
the side conductor gradually decreases in thickness from a thick portion in a middle of the side conductor in a thickness direction of the insulating substrate to thin portions disposed on a side of the third main surface and on a side of the first main surface, and comprises an inclination portion which gradually increases in thickness from a boundary between the cut surface in the insulating substrate and the side conductor to an inner surface of the side conductor, in vertical sectional view.

5. The electronic component housing package according to claim 4, wherein the cut surface comprises a first cut surface which is disposed on the side of the first main surface and comprises a first curve portion in an edge on a side of the fracture surface, and a second cut surface which is disposed on a side of the second main surface and comprises a second curve portion in an edge on the side of the fracture surface, and the first curve portion of the first cut surface has a width greater than a width of the second curve portion of the second cut surface in the inner surface of the side conductor, in vertical sectional view.

6. The electronic component housing package according to claim 5, wherein the inclination portion gradually increases in width from the first main surface to the first curve portion of the first cut surface.

7. An electronic device, comprising:
the electronic component housing package according to claim 4; and
an electronic component mounted on the electronic component housing package.

8. An electronic module, comprising:
the electronic device according to claim 7; and
a module substrate connecting to the electronic device.

9. An electronic device, comprising:
the electronic component housing package according to claim 5; and
an electronic component mounted on the electronic component housing package.

10. An electronic device, comprising:
the electronic component housing package according to claim 6; and
an electronic component mounted on the electronic component housing package.

11. An electronic module, comprising:
the electronic device according to claim 9; and
a module substrate connecting to the electronic device.

12. An electronic module, comprising:
the electronic device according to claim 10; and
a module substrate connecting to the electronic device.

* * * * *